United States Patent
Liao et al.

(10) Patent No.: US 11,107,737 B2
(45) Date of Patent: Aug. 31, 2021

(54) CONTROL WAFER AND METHOD FOR FABRICATING SEMICONDUCTOR DEVICE

(71) Applicant: Taiwan Semiconductor Manufacturing Co., Ltd., Hsinchu (TW)

(72) Inventors: Chun-Hao Liao, Hsinchu (TW); Chu-Fu Chen, Hsinchu County (TW); Jui-Yean Chiu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 360 days.

(21) Appl. No.: 16/396,774

(22) Filed: Apr. 29, 2019

(65) Prior Publication Data

US 2019/0252272 A1    Aug. 15, 2019

Related U.S. Application Data

(62) Division of application No. 15/472,306, filed on Mar. 29, 2017, now Pat. No. 10,276,457.

(51) Int. Cl.
| | |
|---|---|
| *H01L 27/02* | (2006.01) |
| *H01L 21/66* | (2006.01) |
| *H01L 27/092* | (2006.01) |
| *H01L 21/8238* | (2006.01) |
| *H01L 21/265* | (2006.01) |

(52) U.S. Cl.
CPC ............ *H01L 22/14* (2013.01); *H01L 21/265* (2013.01); *H01L 21/823892* (2013.01); *H01L 22/34* (2013.01); *H01L 27/0928* (2013.01)

(58) Field of Classification Search
CPC ......... H01L 21/823892; H01L 27/0207; H01L 27/0928
See application file for complete search history.

(56) References Cited

U.S. PATENT DOCUMENTS 5,977,592 A * 11/1999 Baba .................... H01L 27/0928
257/355

* cited by examiner

*Primary Examiner* — Mohammad M Choudhry
(74) *Attorney, Agent, or Firm* — JCIPRNET

(57) ABSTRACT

A method for fabricating a semiconductor device includes at least the following steps. First, a substrate having a first conductivity type is provided and the substrate is doped with a second conductivity type dopant to form a first well region and a second well region in the substrate, wherein the first conductivity type is opposite to the second conductivity type. An inverter is formed in the first well region. A control transistor and a reference transistor are formed in the second well region, wherein the inverter is electrically connected to the control transistor. An electrical connection path is formed between the inverter and a gate of the control transistor. A difference between electrical parameters of the control transistor and the reference transistor in the control wafer is measured to obtain a measuring result. The semiconductor device having a layout design is fabricated based on the measuring result.

20 Claims, 4 Drawing Sheets

CONTROL WAFER AND METHOD FOR FABRICATING SEMICONDUCTOR DEVICE

CROSS-REFERENCE TO RELATED APPLICATION

This application is a divisional application of U.S. application Ser. No. 15/472,306, filed on Mar. 29, 2017, now allowed. The entirety of the above-mentioned patent application is hereby incorporated by reference herein and made a part of this specification.

BACKGROUND

The semiconductor integrated circuit (IC) industry has experienced rapid growth. Over the course of this growth, functional density of the devices has generally increased by the device feature size. The scaling down process generally provides benefits by increasing production efficiency, lower costs, and/or improving performance. Such scaling down has also increased the complexities of processing and manufacturing ICs. For example, charge accumulation during fabrication may induce reliability issues and is required to be monitored. For these advances to be realized, developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
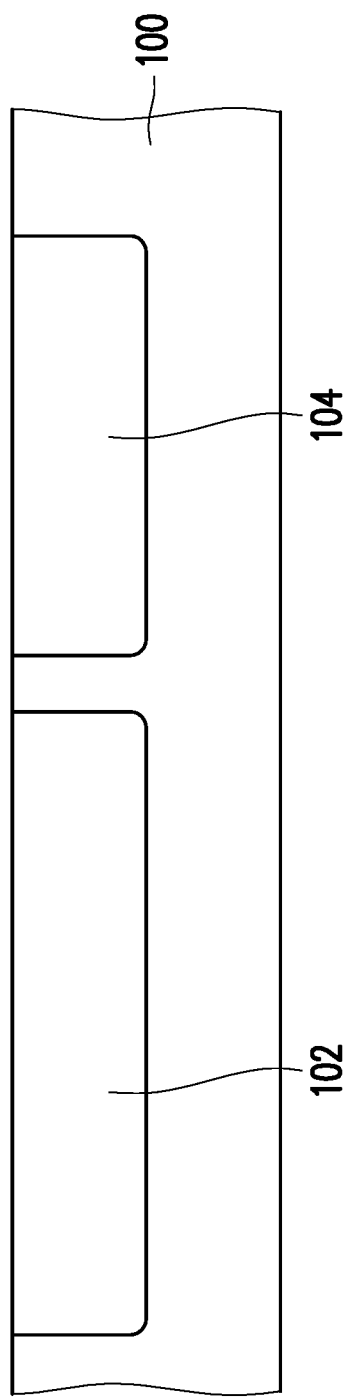
FIGS. 1A-1B are schematic view illustrating a method for measuring charge accumulation in a fabrication process of a semiconductor device and a method for fabricating a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
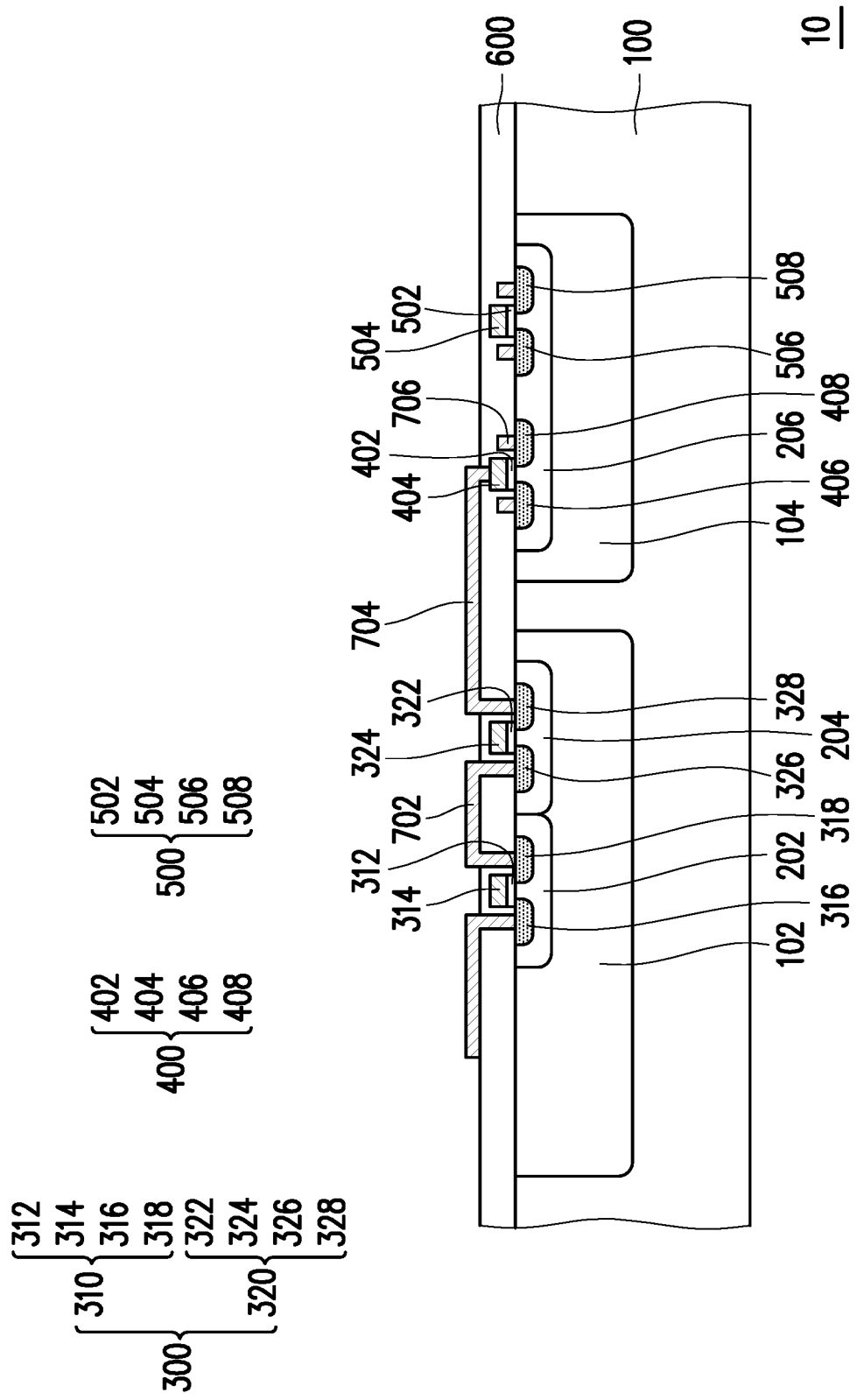

FIGS. 1A-1B are schematic view illustrating a method for measuring charge accumulation in a fabrication process of a semiconductor device and a method for fabricating a semiconductor device in accordance with some embodiments of the disclosure. In FIGS. 1A-1B, a control wafer 10 is first fabricated. Thereafter, an evaluation process is performed on the control wafer 10. Subsequently, a device wafer (not illustrated) is manufactured based on the evaluation results obtained from the control wafer 10.

Referring to FIG. 1A, a substrate 100 is provided. An exemplary material of the substrate 100 includes silicon, an alloy semiconductor such as silicon germanium, silicon germanium carbide, gallium arsenic phosphide, or gallium indium phosphide, or other semiconductor materials. In addition, the substrate 100 may be a semiconductor on insulator, such as silicon on insulator (SOI) or silicon on sapphire. Alternatively or additionally, the substrate 100 includes other elementary semiconductor materials such as germanium, gallium arsenic, or other suitable semiconductor materials. In some embodiments, the substrate 100 has a first conductivity type. For example, the substrate 100 may be a p-type substrate. However, it construes no limitation in the disclosure. Intrinsic semiconductor substrate or n-type substrate may also be utilized as the substrate 100. In some embodiments, the substrate 100 further includes other features such as various doped regions, a buried layer, and/or an epitaxy layer. For instance, referring to FIG. 1A, the substrate 100 is doped with a second conductivity type dopant to form a first well region 102 and a second well region 104 in the substrate 100. The second conductivity type is different from the first conductivity type. In some embodiments, the first conductivity type is p-type and the second conductivity type is n-type. However, in some alternative embodiments, these types may be interchanged. The n-type dopant includes, for example, boron or $BF_2$. On the other hand, the p-type dopant may include phosphorous or arsenic. In some embodiments, the first well region 102 and the second well region 104 are respectively referred to as first n-well region 102 and second n-well region 104. As illustrated in FIG. 1A, an area of the first well region 102 is larger than an area of the second well region 104.

Referring to FIG. 1B, an inverter 300 is formed in the first well region 102. On the other hand, a control transistor 400 and a reference transistor 500 are formed in the second well region 104. In some embodiments, the inverter 300, the control transistor 400, and the reference transistor 500 may be formed at the same time by the same fabrication process. In some alternative embodiments, the inverter 300, the control transistor 400, and the reference transistor 500 may be formed separately.

The inverter 300 includes a first conductivity type transistor 320 and a second conductivity type transistor 310 adjacent to the first conductivity type transistor 320. In some embodiments, the first conductivity type transistor 320 may be referred to as PMOS (p-channel metal-oxide-semiconductor) transistor 320 and the second conductivity type transistor 310 may be referred to as NMOS (n-channel metal-oxide-semiconductor) transistor 310. Referring to FIG. 1B, a well 202 and a well 204 may be formed in the first well region 102. Subsequently, the NMOS transistor 310 is formed over the well 202 and the PMOS transistor 320 is formed over the well 204. The well 202 and the well 204 are doped with dopants, and the type of dopants depends on the transistor subsequently formed thereon. In some embodiments, the well 202 is doped with p-type dopants and the well 204 is doped with n-type dopants. An isolation region (not illustrated) may be formed between the well 202 and the well 204 to isolate the NMOS transistor 310 and the PMOS transistor 320. The isolation region utilizes isolation technology, such as local oxidation of silicon (LOCOS) or shallow trench isolation (STI) to electrically isolate various regions. If the isolation regions are made of STIs, the STI region comprises silicon oxide, silicon nitride, silicon oxynitride, other suitable materials, or a combination thereof.

The NMOS transistor 310 includes a gate dielectric layer 312, a gate 314, a source 316, and a drain 318. Similarly, the PMOS transistor 320 includes a gate dielectric layer 322, a gate 324, a source 326, and a drain 328. The gate dielectric layers 312 and 322 include silicon oxide, silicon nitride, silicon oxy-nitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. The gates 314 and 324 are formed by depositing a metal material over the gate dielectric layers 312 and 322 through suitable processes such as atomic layer deposition (ALD), chemical vapor deposition (CVD), physical vapor deposition (PVD), plating, or a combination thereof. In some embodiments, gate 314 includes Ti, Ag, Al, TiAl, TiAlN, TaC, TaCN, TaSiN, Mn, or Zr for an NMOS device and gate 324 includes TiN, WN, TaN, or Ru for a PMOS device.

The source 316 and the drain 318 are formed in the well 202 and are located on two opposite sides of the gate 314 disposed over the well 202. Similarly, the source 326 and the drain 328 are formed within the well 204 and are located on two opposite sides of the gate 324 disposed over the well 204. The sources 316, 326 and the drains 318, 328 may be heavily doped regions. In some embodiments, the sources 316, 326 and the drains 318, 328 may be formed by one or more ion implantation process. However, other suitable methods may also be utilized to form the sources 316, 326 and the drains 318, 328. In some alternative embodiments, the formation of the sources 316, 326 and the drains 318, 328 may include recessing part of the substrate 100 through etching or other suitable processes and filling epitaxial materials in the recessed region through epitaxy growth. Specifically, the epitaxial materials include SiGe, SiC, or other suitable materials. For example, the source 316 and the drain 318 may be formed through epitaxy growth while the source 326 and the drain 328 may be formed through ion implantation. The dopants for the sources 316, 326 and the drains 318, 328 may be of opposite conductivity type as that of the respective well regions. For instance, if the well 202 is a p-type well, the source 316 and the drain 318 may be doped with an n-type dopant. On the other hand, if the well 204 is an n-type well, the source 326 and the drain 328 may be doped with a p-type dopant.

It is understood that the inverter 300 of the disclosure may be formed by CMOS technology processing, and thus some processes are not described in detail herein.

Referring to FIG. 1B, a well 206 may be formed in the second well region 104. Subsequently, the control transistor 400 and the reference transistor 500 are formed over the well 206. Unlike the NMOS transistor 310 and the PMOS transistor 320 of the inverter 300 which respectively includes its own well, the control transistor 400 and the reference transistor 500 share the same well 206. The well 206 is doped with dopants, and the type of dopants depends on the transistor subsequently formed thereon. In some embodiments, the well 206 is doped with p-type dopants. An isolation region (not illustrated) may be formed between the control transistor 400 and the reference transistor 500 to isolate the control transistor 400 and the reference transistor 500. The isolation region herein is similar to the isolation region between the NMOS transistor 310 and the PMOS transistor 320, so detailed description thereof is omitted.

The control transistor 400 includes a gate dielectric layer 402, a gate 404, a source 406, and a drain 408. On the other hand, the reference transistor 500 includes a gate dielectric layer 502, a gate 504, a source 506, and a drain 508. The gate dielectric layers 402 and 502 include silicon oxide, silicon nitride, silicon oxy-nitride, high-k dielectric materials, or a combination thereof. The gates 404 and 504 are formed by depositing a metal material over the gate dielectric layers 402 and 502 through suitable processes such as atomic layer deposition (ALD), chemical vapor deposition (CVD), physical vapor deposition (PVD), plating, or a combination thereof. The gates 404 and 504 include Ti, Ag, Al, TiAl, TiAlN, TaC, TaCN, TaSiN, Mn, or Zr for an NMOS device and TiN, WN, TaN, or Ru for a PMOS device. In some embodiments, the control transistor 400 and the reference transistor 500 are both NMOS transistors. However, it construes no limitation in the disclosure. In some alternative embodiments, the control transistor 400 and the reference transistor 500 may be PMOS transistors.

The source 406 and the drain 408 are formed in the well 206 and are located on two opposite sides of the gate 404 disposed over the well 206. Similarly, the source 506 and the drain 508 are formed within the well 206 and are located on two opposite sides of the gate 504 disposed over the well 206. The sources 406, 506 and the drains 408, 508 may be heavily doped regions. The formation method of the sources 406, 506 and the drains 408, 508 may be similar to that of the sources 316, 326 and the drains 318, 328, so the detailed description thereof is omitted herein. The dopants for the sources 406, 506 and the drains 408, 508 may be of opposite conductivity type as that of the respective well region. For instance, if the well 206 is a p-type well, the sources 406, 506 and the drains 408, 508 may be doped with an n-type dopant.

Referring to FIG. 1B, an interlayer dielectric layer 600 is formed aside of the gates 314, 324, 404, and 504. The interlayer dielectric layer 600 is formed to cover the inverter 300, the control transistor 400, and the reference transistor 500. The interlayer dielectric layer 600 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the interlayer dielectric layer 600 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 600 may include one or more dielectric materials and/or one or more dielectric layers. In some embodiments, the interlayer dielectric layer 600 is formed to a suitable thickness by Flowable CVD (FCVD), CVD, HDPCVD, SACVD, spin-on, sputtering, or other suitable methods.

The interlayer dielectric layer 600 includes a plurality of contact holes exposing the sources, the drains, and the gates of the NMOS transistor 310, the PMOS transistor 320, the control transistor 400, and the reference transistor 500. The contacts 702, 704, and 706 are filled into the contact holes. The contacts 702, 704, and 706 include conductive materials. For example, the contacts 702, 704, and 706 may include metallic materials having excellent conductivity such as copper, tungsten, cobalt, the alloys thereof, or combinations thereof. As illustrated in FIG. 1B, the contact 702 electrically connects the drain 318 of the NMOS transistor 310 and the source 326 of the PMOS transistor 320 such that the NMOS transistor 310 and the PMOS transistor 320 may form an inverter. It should be noted that the layout and the connection between elements in the inverter 300 shown in FIG. 1B merely serve as an illustrative example, and the configuration of the metal contact 702 may be altered based on circuit design. The inverter 300 is electrically connected to the control transistor 400. In some embodiments, the inverter 300 includes an output terminal, and the output terminal is electrically connected to the gate 404 of the control transistor 400. The output terminal is, for example, the drain 328 of the PMOS transistor 320. In some embodiments, the drain 328 of the MOS transistor 320 may be electrically connected to the gate 404 of the control transistor 400 through the contact 704. The contacts 706 are disposed over the sources 406, 506 and the drains 408, 508 of the control transistor 400 and the reference transistor 500. The contacts 706 are illustrated as embedded in the interlayer dielectric layer 600 in the cross-sectional view of FIG. 1B. However, in some other cross-sectional views, the contacts 706 may extend over the interlayer dielectric layer 600 through contact holes to serve as contacts of the sources 406, 506 and the drains 408, 508 to other elements.

During the process of fabricating the elements of the control wafer 10, charges may accumulate in the device. For example, charges may accumulate in the first well region 102. Since the drain 328 of the PMOS transistor 320 is electrically connected to the gate 404 of the control transistor 400 through the contact 704, charges accumulated in the first well region 102 and the inverter 300 may be transmitted to the control transistor 400. As such, a wafer acceptance test (WAT) may be performed to evaluate the charge accumulation by measuring electrical parameters of the control transistor 400 and the reference transistor 500. In other words, the electrical parameters of the control transistor 400 may reflect the charge accumulation of the first well region 102 while the electrical parameters of the reference transistor 500 may reflect the charge accumulation of the second well region 104. It should be noted that although charges may accumulate in the second well region 104, the accumulation is negligible as compared to the first well region 102 due to the area difference in these well regions. Therefore, the charge accumulation of the first well region 102 may be precisely determined through measuring the electrical parameters of the control transistor 400.

In some embodiments, electrical parameters of the control transistor 400 and the reference transistor 500 may be measured and compared. For example, an off-state current (Ioff), a threshold voltage (Vth), or a combination thereof of the control transistor 400 and the reference transistor 500 may be measured. Subsequently, the values obtained may be compared. If the difference between values obtained exceed a predetermined range (for example, 3-5% for off-state current), the control wafer 10 may be labelled as inoperable. On the other hand, if the difference between values obtained falls within the predetermined range, the control wafer 10 may be labelled as operable. If the control wafer 10 is labelled as operable, a device wafer (not illustrated) may be designed and fabricated based on the dimensions of the elements in the control wafer 10. On the contrary, if the control wafer 10 is labelled as inoperable, another control wafer (not illustrated) having different layout design/element dimensions as that of the control wafer 10 may be fabricated. Subsequently, the foregoing step may be repeated again until the new control wafer is being labelled as operable. Thereafter, a device wafer may be designed and fabricated based on the dimensions of the elements in the newly fabricated control wafer. Therefore, the operability of the device wafer may be ensured. In some embodiments, based on the value obtained by measuring the electrical parameters of the control transistor 400 and the reference transistor 500, the charge accumulation reference value in the first well region 102 and the second well region 104 may be calculated.

Figure 2A:
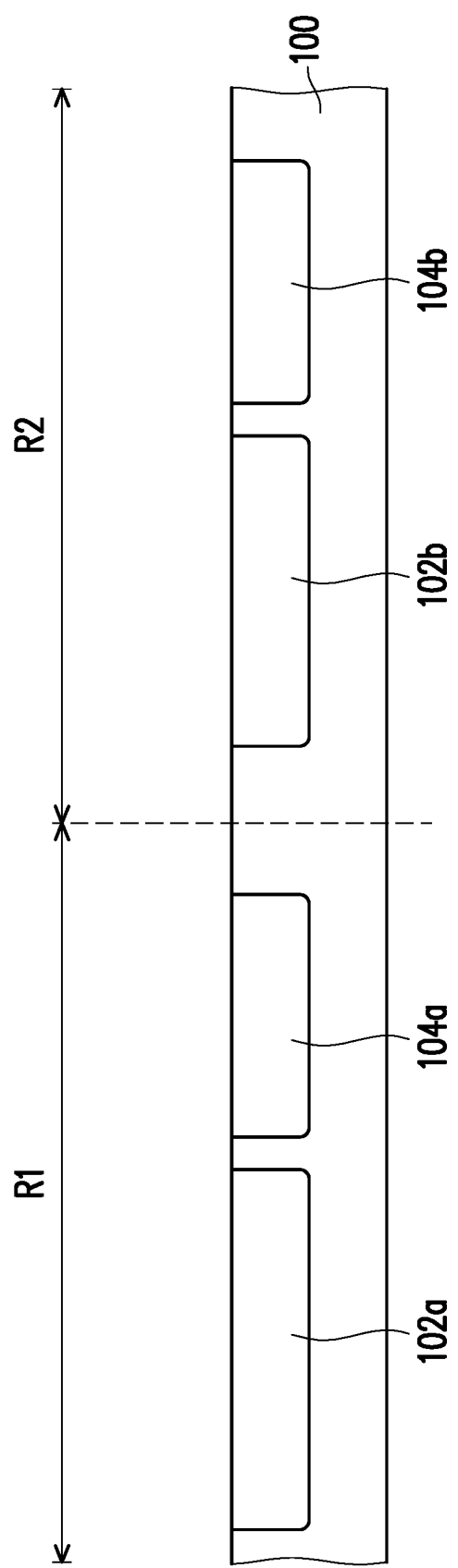
FIGS. 2A-2B are schematic view illustrating a method for measuring charge accumulation in a fabrication process of a semiconductor device and a method for fabricating a semiconductor device in accordance with some alternative embodiments of the disclosure.
Figure 2B:
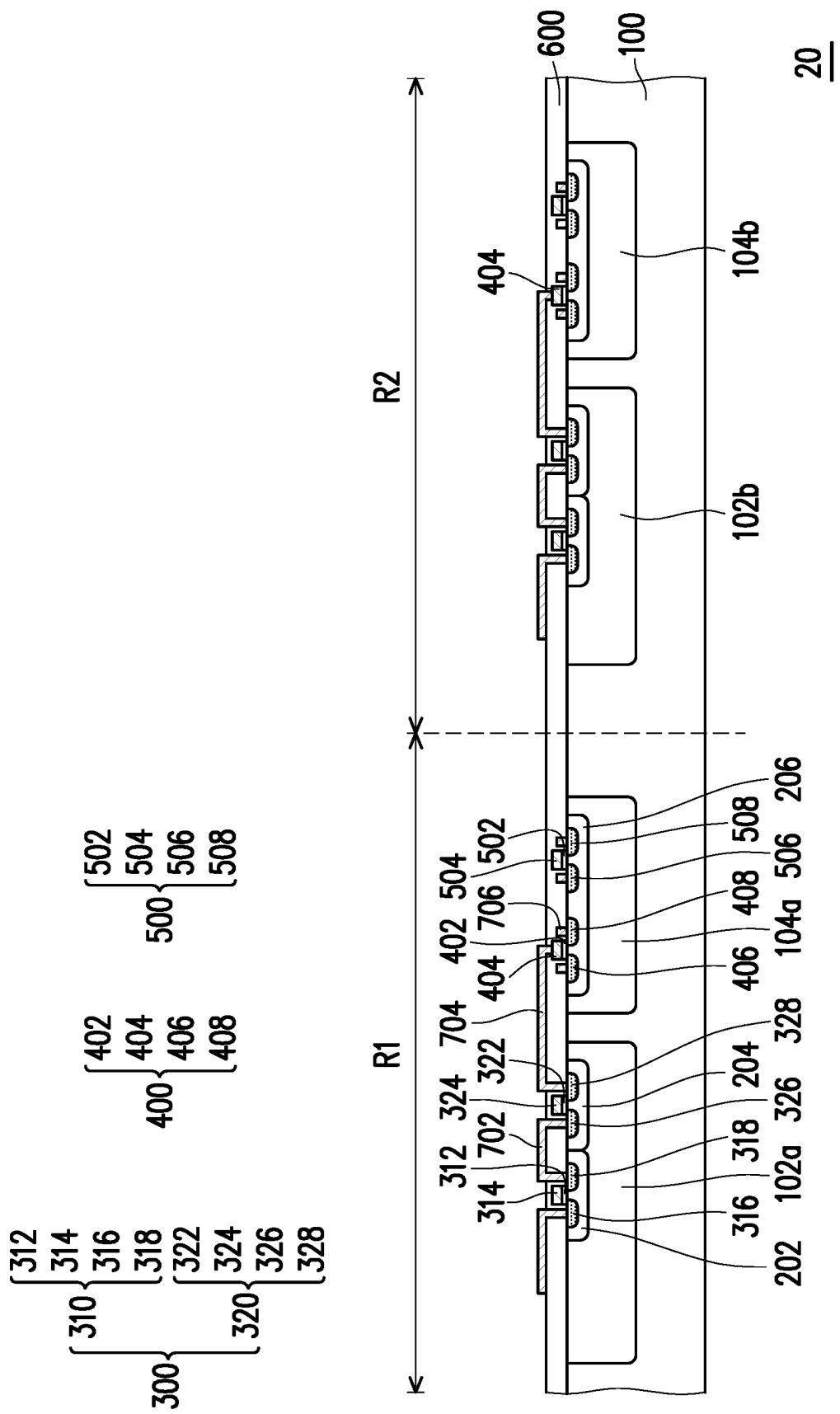

FIGS. 2A-2B are schematic view illustrating a method for measuring charge accumulation in a fabrication process of a semiconductor device and a method for fabricating a semiconductor device in accordance with some alternative embodiments of the disclosure. In FIGS. 2A-2B, a control wafer 20 is first fabricated. Thereafter, an evaluation process is performed on the control wafer 20. Subsequently, a device wafer (not illustrated) is manufactured based on the evaluation results obtained from the control wafer 20.

Referring to FIGS. 2A-2B, the embodiment of FIGS. 2A-2B is similar to the embodiment of FIGS. 1A-1B, so similar elements are denoted by the same reference numeral and the detailed description thereof is omitted herein. A substrate 100 having a plurality of testing regions arranged in an array is provided. Referring to FIG. 2A, the substrate 100 is divided into a first testing region R1 and a second testing region R2. A first n-well region 102a and a second n-well region 104a are formed in the first testing region R1 while a first n-well region 102b and a second n-well region 104b are formed in the second testing region R1. An area of the second n-well region 104a in the first testing region R1 is substantially equal to an area of the second n-well region 104b in the second testing region R2. On the other hand, an area of the first n-well region 102a in the first testing region R1 is larger than an area of the first n-well region 102b in the second testing region R2. The area of the first n-well region 102a is larger than the area of the second n-well region 104a, and the area of the first n-well region 102b is larger than the area of the second n-well region 104b.

Referring to FIG. 2B, inverters 300 are respectively formed in the first n-well region 102a and the first n-well region 102b. On the other hand, control transistors 400 and reference transistors 500 are respectively formed in the second n-well region 104a and the second n-well region 104b. Each of the inverter 300 includes an NMOS transistor 310 and a PMOS transistor 320 adjacent to the NMOS transistor 310. Similar to the embodiment of FIGS. 1A-1B, a drain 328 of the PMOS transistor 320 is electrically connected to a gate 404 of the control transistor 400 in both of the first testing region R1 and the second testing region R2. Referring to FIG. 2B, an area of the gate 404 of the control transistor 400 in the first testing region R1 is substantially equal to an area of the gate 404 of the control transistor 400 in the second testing region R2. As mentioned above, the area of the first n-well region 102a in the first testing region R1 is different from the area of the first n-well region 102b in the second testing region R2. Therefore, a ratio of the area of the first n-well region 102a to the area of the gate 404 of the control transistor 400 in the first testing region R1 is different from a ratio of the area of the first n-well region 102b to the area of the gate 404 of the control transistor 400 in the second testing region R2. It should be noted that although FIGS. 2A-2B illustrated two testing regions, the number of the testing regions is not limited thereto. In some alternative embodiments, more than two testing regions having differences in sizes of the first n-well region may be found in the substrate 100.

During the process of fabricating the elements of the control wafer 20, charges may accumulate in the device. For example, charges may accumulate in the first n-well region 102a and the first n-well region 102b. Since the drain 328 of the PMOS transistor 320 is electrically connected to the gate 404 of the control transistor 400 through the contact 704 in both of the first testing region R1 and the second testing region R2, charges accumulated in the first n-well region 102a and the first n-well region 102b may be transmitted to the corresponding control transistor 400. As such, a wafer acceptance test (WAT) may be performed to evaluate the charge accumulation by measuring electrical parameters of the control transistor 400 and the reference transistor 500 in the first testing region R1 and the second testing region R2. In other words, the electrical parameters of the control transistors 400 may reflect the charge accumulation of the first n-well region 102a and the first n-well region 102b while the electrical parameters of the reference transistors 500 may reflect the charge accumulation of the second n-well region 104a and the second n-well region 104b. It should be noted that although charges may accumulate in the second n-well region 104a and the second n-well region 104b, the accumulation is negligible as compared to the first n-well region 102a and the first n-well region 102b due to the area difference in these well regions. Therefore, the charge accumulation of the first n-well region 102a and the first n-well region 102b may be precisely determined through measuring the electrical parameter of the control transistors 400.

In some embodiments, electrical parameters of the control transistors 400 and the reference transistors 500 in the first testing region R1 and the second testing region R2 may be measured and compared. For example, an off-state current (Ioff), a threshold voltage (Vth), or a combination thereof of the control transistors 400 and the reference transistors 500 may be measured. Subsequently, the values obtained may be compared. If the difference between values obtained exceed a predetermined range (for example, 3-5% for off-state current), the testing region may be labelled as inoperable. On the other hand, if the difference between values obtained falls within the predetermined range, the testing region may be labelled as operable. Based on the operability of the testing regions, a threshold condition may be determined. In some embodiments, the testing regions labelled as operable are picked. Subsequently, dimensions of the elements in these operable testing regions are examined. Among the dimensions of the elements in these operable testing regions, the maximum value may be treated as an upper limit and the minimum value may be treated as a lower limit. In some embodiments, the range falls within the upper limit and the lower limit may be referred to as the threshold condition. For example, if both the first testing region R1 and the second testing region R2 are labelled as operable regions, the ratio of the area of the first n-well region 102a to the area of the gate 404 of the control transistor 400 in the first testing region R1 and the ratio of the area of the first n-well region 102b to the area of the gate 404 of the control transistor 400 in the second testing region R2 are examined, so as to obtain a range of threshold condition. Thereafter, a device wafer (not illustrated) having a layout design based on the threshold condition may be formed. In other words, the device wafer may include an n-well region and a gate of a transistor having an area ratio falls within the range obtained above. Therefore, the operability of the device wafer may be ensured.

In some embodiments, based on the value obtained by measuring the electrical parameters of the control transistor 400 and the reference transistor 500, the charge accumulation reference value in the first n-well region 102a, the first n-well region 102b, the second n-well region 104a, and the second n-well region 104b may be calculated.

In some alternative embodiments, instead of a range, the threshold condition may be a threshold value. For example, among the dimensions of the elements in the operable testing regions, the maximum value may be selected as the threshold condition. For instance, if both the first testing region R1 and the second testing region R2 are labelled as operable regions, the ratio of the area of the first n-well region 102a to the area of the gate 404 of the control transistor 400 in the first testing region R1 and the ratio of the area of the first n-well region 102b to the area of the gate 404 of the control transistor 400 in the second testing region R2 are compared. The maximum value among these ratios are treated as the threshold value/threshold condition. In some embodiments, the maximum ratio is $1\times10^5$. Thereafter, a device wafer (not illustrated) having a layout design based on the threshold condition may be formed. In other words, the device wafer may include an n-well region and a gate of a transistor having an area ratio below the threshold value. Therefore, the operability of the device wafer may be ensured.

It should be noted that the foregoing embodiment utilizes a ratio between areas of the n-well region and the gate of the transistor as the basis for determining the threshold condition. However, it construes no limitation in the disclosure. In some alternative embodiments, the dimensions of other elements may also be used to determine the threshold condition.

In accordance with some embodiments of the disclosure, a method for fabricating a semiconductor device includes at least the following steps. First, a substrate having a first conductivity type is provided and the substrate is doped with a second conductivity type dopant to form a first well region and a second well region in the substrate, wherein the first conductivity type is opposite to the second conductivity type. An inverter is formed in the first well region. A control transistor and a reference transistor are formed in the second well region, wherein the inverter is electrically connected to the control transistor. An electrical connection path is formed between the inverter and a gate of the control transistor. A difference between electrical parameters of the control transistor and the reference transistor in the control wafer is measured to obtain a measuring result. The semiconductor device having a layout design is fabricated based on the measuring result.

In accordance with some embodiments of the disclosure, a method for fabricating a semiconductor device includes at least the following steps. First a control wafer is provided. The control wafer includes a substrate, first n-well regions, second n-well regions, inverters, control transistors, and reference transistors. The substrate has a plurality of testing regions. The first n-well region and the second n-well region are in each of the testing regions. The inverter is in each of the first n-well regions. The control transistor and the reference transistor are in each of the second n-well regions. The inverter is electrically connected to the control transistor. Subsequently, a difference between electrical parameters of the control transistor and the reference transistor is measured to determine an operability of each test region. Then, a threshold condition is determined according to the operability of the testing regions. Thereafter, a device wafer having a layout design based on the threshold condition is formed.

In accordance with some embodiments of the disclosure, a control wafer is provided. The control wafer includes a substrate having a plurality of testing regions arranged in an array, a first n-well region in each of the testing regions, a second n-well region in each of the testing regions, an inverter in each of the first n-well regions, a control transistor in each of the second n-well regions, and a reference transistor in each of the second n-well regions. The inverter is electrically connected to the control transistor, and ratios of an area of the first n-well region to an area of a gate of the control transistor is different in each of the testing regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    forming a control wafer, comprising:
        providing a substrate having a first conductivity type;
        doping the substrate with a second conductivity type dopant to form a first well region and a second well region in the substrate, the first conductivity type being opposite to the second conductivity type;
        forming an inverter in the first well region;
        forming a control transistor and a reference transistor in the second well region, the inverter being electrically connected to the control transistor;
        forming an electrical connection path between the inverter and a gate of the control transistor;
    measuring a difference between electrical parameters of the control transistor and the reference transistor in the control wafer to obtain a measuring result; and
    fabricating the semiconductor device having a layout design based on the measuring result.

2. The method according to claim 1, wherein the inverter comprises a first conductivity type transistor and a second conductivity type transistor adjacent to the first conductivity type transistor.

3. The method according to claim 2, wherein the inverter comprises an output terminal electrically connected to the gate of the control transistor.

4. The method according to claim 3, wherein the output terminal comprises a drain of the first conductivity type transistor.

5. The method according to claim 1,
    wherein measuring the difference between electrical parameters of the control transistor and the reference transistor in the control wafer to obtain the measuring result comprising: measuring a difference between electrical parameters of the control transistor and the reference transistor to determine an operability of the substrate; and determining a threshold condition according to the operability of the substrate;
    wherein fabricating the semiconductor device having the layout design based on the measuring result comprising forming the semiconductor device having a layout design based on the threshold condition.

6. The method according to claim 5, wherein the electrical parameters comprise an off-state current ($I_{off}$), a threshold voltage ($V_{th}$), or a combination thereof.

7. The method according to claim 1, wherein an area of the first well region is larger than an area of the second well region.

8. A method for fabricating a semiconductor device, comprising:
    providing a control wafer, wherein the control wafer comprises:
        a substrate having a plurality of testing regions;
        a first n-well region and a second n-well region in each of the testing regions;
        an inverter in each of the first n-well regions; and
        a control transistor and a reference transistor in each of the second n-well regions, wherein the inverter is electrically connected to the control transistor;
    measuring a difference between electrical parameters of the control transistor and the reference transistor to determine an operability of each testing region;
    determining a threshold condition according to the operability of the testing regions; and
    forming a device wafer having a layout design based on the threshold condition.

9. The method according to claim 8, wherein ratios of an area of the first n-well region to an area of a gate of the control transistor are different in each of the testing regions.

10. The method according to claim 8, wherein the threshold condition comprises a maximum ratio among ratios of an area of the first n-well region to an area of a gate of the control transistor of the operable testing regions.

11. The method according to claim 10, wherein the maximum ratio is $1 \times 10^5$.

12. The method according to claim 8, wherein the electrical parameters comprise an off-state current ($I_{off}$), a threshold voltage ($V_{th}$), or a combination thereof.

13. The method according to claim 8, wherein the inverter comprises an NMOS (n-channel metal-oxide-semiconductor) transistor and a PMOS (p-channel metal-oxide-semiconductor) transistor adjacent to the NMOS transistor, and the PMOS transistor comprises an output terminal electrically connected to a gate of the control transistor.

14. The method according to claim 13, wherein the output terminal comprises a drain of the PMOS transistor.

15. The method according to claim 8, wherein an area of the first n-well region is larger than an area of the second n-well region.

16. A control wafer, comprising:
    a substrate having a plurality of testing regions arranged in an array, a first n-well region in each of the testing regions, a second n-well region in each of the testing regions, an inverter in each of the first n-well regions, a control transistor in each of the second n-well regions, and a reference transistor in each of the second n-well regions, wherein the inverter is electrically connected to the control transistor, and ratios of an area of the first n-well region to an area of a gate of the control transistor is different in each of the testing regions.

17. The control wafer according to claim 16, wherein the maximum ratio among the ratios of the area of the first n-well region to the area of a gate of the control transistor is about $1 \times 10^5$.

18. The control wafer according to claim 16, wherein the inverter comprises an NMOS (n-channel metal-oxide-semiconductor) transistor and a PMOS (p-channel metal-oxide-semiconductor) transistor adjacent to the NMOS transistor, and the PMOS transistor comprises an output terminal electrically connected to a gate of the control transistor.

19. The control wafer according to claim 18, wherein the output terminal comprises a drain of the PMOS transistor.

20. The control wafer according to claim 16, wherein an area of the first n-well region is larger than an area of the second n-well region.

* * * * *